US012771150B2

(12) United States Patent
Schmidt

(10) Patent No.: US 12,771,150 B2
(45) Date of Patent: Oct. 20, 2026

(54) CALIBRATION OF A BALANCING SYSTEM IN A BATTERY SYSTEM

(71) Applicant: Bayerische Motoren Werke Aktiengesellschaft, Munich (DE)

(72) Inventor: Jan Philipp Schmidt, Holzmaden (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 821 days.

(21) Appl. No.: 17/767,249

(22) PCT Filed: Sep. 24, 2020

(86) PCT No.: PCT/EP2020/076769
§ 371 (c)(1),
(2) Date: Apr. 7, 2022

(87) PCT Pub. No.: WO2021/069233
PCT Pub. Date: Apr. 15, 2021

(65) Prior Publication Data

US 2022/0385079 A1 Dec. 1, 2022

(30) Foreign Application Priority Data

Oct. 11, 2019 (DE) ..................... 10 2019 127 408.7

(51) Int. Cl.
*H01M 10/48* (2006.01)
*B60L 58/22* (2019.01)
(Continued)

(52) U.S. Cl.
CPC ................ *H02J 7/54* (2026.01); *B60L 58/22* (2019.02); *G01R 31/388* (2019.01);
(Continued)

(58) Field of Classification Search
CPC . G01R 31/388; G01R 31/392; H01M 10/482; H01M 2220/20;
(Continued)

(56) References Cited

U.S. PATENT DOCUMENTS 10,355,504 B2 * 7/2019 Becker ................. G01R 31/389
2007/0090844 A1 * 4/2007 Klang ................... H01M 10/48 324/426
(Continued)

FOREIGN PATENT DOCUMENTS

CN 201230222 Y 4/2009
CN 101882699 A 11/2010
(Continued)

OTHER PUBLICATIONS

Japanese-language Office Action issued in Japanese Application No. 2022-521241 dated Jun. 14, 2023 with English translation (6 pages).
(Continued)

*Primary Examiner* — Julian D Huffman
*Assistant Examiner* — Lisa Kotowski
(74) *Attorney, Agent, or Firm* — Crowell & Moring LLP

(57) ABSTRACT

A method is provided for calibrating a passive balancing system in a battery system which has a plurality of lithium ion cells and a battery management system, in which cell units consisting of individual cells or parallel-connected groups of a plurality of cells are each provided with a discharge circuit having a load resistance Ri representing the calibration parameter, and the cell units are serially connected in series. The battery management system is designed to measure the voltage $U_i$ of each cell unit and to actuate the discharge circuit at a selectable time in order to discharge the cell unit in a controlled manner via the load resistance $R_i$. The method includes actuating the discharge circuit of the cell unit for a discharge time $t_i$ in order to remove a charge
(Continued)

$Q_i$, and determining $t_i$, $Q_i$ and the voltage characteristic over time $U_i(t)$; and determining $R_i$.

3 Claims, 2 Drawing Sheets

(51) Int. Cl.

| | |
|---|---|
| ***G01R 31/388*** | (2019.01) |
| ***G01R 31/392*** | (2019.01) |
| ***G01R 31/396*** | (2019.01) |
| ***H01M 10/42*** | (2006.01) |
| ***H02J 7/54*** | (2026.01) |
| ***H02J 7/82*** | (2026.01) |
| ***H02J 7/84*** | (2026.01) |

(52) U.S. Cl.
CPC ......... *G01R 31/392* (2019.01); *G01R 31/396* (2019.01); *H01M 10/482* (2013.01); *H02J 7/82* (2026.01); *H02J 7/84* (2026.01); *H01M 2010/4271* (2013.01); *H01M 2220/20* (2013.01)

(58) Field of Classification Search
CPC ........... H01M 2010/4271; H02J 7/0048; H02J 7/005; H02J 7/0014; H02J 7/0016; H02J 7/0018; H02J 7/0019; Y02E 60/10; B60L 11/1866; B60L 58/22
USPC .......................................................... 320/134
See application file for complete search history.

(56) References Cited

U.S. PATENT DOCUMENTS

2007/0285058 A1 12/2007 Kuroda
2010/0171503 A1 7/2010 Fredette
2014/0306662 A1 10/2014 Kim et al.
2014/0346775 A1* 11/2014 Takeo .................. H02K 7/1815 290/50
2015/0077039 A1* 3/2015 Soong ..................... B60L 53/16 320/107
2018/0069417 A1* 3/2018 Becker .................. H01M 10/44
2020/0166582 A1 5/2020 Mensler et al.

FOREIGN PATENT DOCUMENTS

| | | | | |
|---|---|---|---|---|
| CN | 102231546 | A | 11/2011 | |
| CN | 107431370 | A | 12/2017 | |
| CN | 108448179 | A | 8/2018 | |
| DE | 102015205725 | A1 * | 10/2016 | ............ H01M 10/48 |
| JP | 2010-541520 | A | 12/2010 | |
| JP | 2014-226029 | A | 12/2014 | |
| KR | 10-2012-0096396 | A | 8/2012 | |
| WO | WO 2019/016218 | A1 | 1/2019 | |

OTHER PUBLICATIONS

International Search Report (PCT/ISA/210) issued in PCT Application No. PCT/EP2020/076769 dated Nov. 12, 2020 with English translation (four (4) pages).
German-language Written Opinion (PCT/ISA/237) issued in PCT Application No. PCT/EP2020/076769 dated Nov. 12, 2020 (five (5) pages).
German-language Search Report issued in German Application No. 10 2019 127 408.7 dated Sep. 22, 2020 with partial English translation (10 pages).
Chinese-language Office Action issued in Chinese Application No. 202080069616.8 dated Jun. 27, 2025 with English translation (15 pages).

* cited by examiner

CALIBRATION OF A BALANCING SYSTEM IN A BATTERY SYSTEM

FIELD

The present invention relates to a method for calibrating a balancing system in a battery system.

BACKGROUND

Battery System

Battery systems for electric or hybrid electric vehicles comprise a plurality of individual secondary cells which are connected to one another in parallel and in series, typically lithium-ion cells, which are controlled by a battery management system (BMS).

The function of the BMS includes, inter alia, monitoring the operating data such as the cell voltage, the state of charge (SOC), the state of health (SOH), the current and the temperature, and controlling the charging or discharging of the cells. Further tasks of the BMS include the thermal management of the battery system, the protection of the cells and the prediction of the remaining service life of the cells, on the basis of the operating data recorded.

The individual cells can be connected in series in the battery system in order to achieve the desired voltage, for example 200 to 400 V. As an alternative, in order to increase the capacitance, a plurality of cells can be connected in parallel in groups and the cell groups thus obtained are in turn connected in series. From the point of view of the BMS, the cell groups connected in parallel behave like individual cells with respect to voltage and SOC monitoring and also in relation to the balancing, which will be described in more detail below. In the following text, individual cells and parallel-connected groups of individual cells are therefore collectively referred to as “cell units”.

Balancing

A key function of the BMS is what is known as balancing, which involves the equalization of the state of charge of the individual cells or cell groups. It may be that the state of charge (SOC) of individual cells deviates from the SOC of the remaining cells in a cell assembly, for example as a result of increased self-discharging on account of an uneven temperature distribution or variations in manufacture.

Such an unevenness becomes noticeable by the cell voltages drifting apart from one another and may lead to a shortening of the service life and increased wear of the cells. The same also applies to parallel-connected groups of individual cells, which from the outside behave like a single cell with a correspondingly greater capacitance. During balancing, the state of charge of the cell units (that is to say of the individual cells or cell groups) are matched to one another in order to restore equilibrium.

A distinction is generally drawn between active and passive balancing methods. In active balancing methods, charge is transferred from a cell unit having an increased SOC to a cell unit having a lower SOC. This can be executed by means of a charge-transferring element such as, for example, a capacitor, a coil and/or a voltage converter. In passive balancing methods, conversely, in cells having an increased SOC, the surplus charge is simply dissipated by means of a resistor (shunt), until the state of charge is equalized.

The charge transferred (that is to say drawn and, in active balancing, possibly also supplied) per cell during balancing and the distribution thereof across the individual cells of the battery system provides conclusions about the extent of self-discharging, which in turn makes it possible to indicate the state of health (SOH) and possibly also the risk of an internal short-circuit occurring. There is therefore a need for methods for precise determination of the balancing charge.

Problem

In principle, the balancing charge can be determined from the cell voltage, the duration of the actuation of the balancing circuit and the characteristics of the balancing circuit itself. In the event of passive balancing, the balancing current can be calculated as $I(t)=U(t)/R$ from the resistance value R of the load resistor (shunt) and the voltage profile U(t) measured during the balancing, and integration over the duration of the actuation of the balancing system provides the charge that flowed.

In this case, however, there is the difficulty that although the voltage profile and the time are known to a good degree of accuracy, the accuracy of the charge determination depends on the tolerance of the load resistor. For reasons of cost, the use of highly precise load resistors or an individual re-measurement of the precise resistance values is not considered for most applications.

There is therefore a need for a calibration method for determining the balancing charge with a high degree of accuracy and which can be carried out without a relatively large outlay in a preconfigured battery system with passive balancing in which the precise resistance values of the load resistors are not known. The method should also preferably be able to be carried out in field deployment or in running operation without specific equipment of laboratory quality being required.

SUMMARY

The invention relates to a method for calibrating a passive balancing system in a battery system comprising a plurality of lithium-ion cells and a battery management unit (BMU).

In the battery system used in accordance with the invention, cell units composed of individual cells or parallel-connected groups of a plurality of cells are each connected in series in strings. Each cell unit (that is to say individual cell or block of parallel-connected cells) is provided with a discharge circuit having a load resistor $R_i$, wherein the value of $R_i$ represents the calibration parameter. The BMU is additionally set up to measure the voltage $U_i$ of each cell unit and to actuate the discharge circuit at a selectable time in order to discharge the cell unit i in a controlled manner via the load resistor $R_i$.

The method according to the invention comprises the following steps:

- actuation of the discharge circuit of the cell unit i for a discharge time $t_i$;
- ascertainment of the charge $Q_i$ drawn during the discharge time $t_i$ and the voltage profile over time $U_i(t)$;
- determination of $R_i$ as:

$$R_i = \frac{1}{Q_i}\int_0^{t_i} U_i(t)\,dt.$$

For the determination of $Q_i$, in particular the supplying of a previously known charge and its subsequent dissipation via the balancing system and the calculation from the voltage based on the previously mentioned differential capacitance $C_i=dQ_i/dU_i$ of the cell are considered as alternatives.

Using the calibration method according to the invention, the precise values for the load resistors $R_i$ can be ascertained, which in turn ascertains the precise determination of the amount of charge that flowed during balancing, which in turn can be used for diagnosis (for example for internal soft short circuits that are starting). The calibration method can likewise also be applied time after time over the entire service life of the battery system without making it necessary to visit a workshop.

DETAILED DESCRIPTION OF THE DRAWINGS

The following text describes in more detail the structure of the battery system in which the method is used and the embodiments of the method itself.

Battery System and Balancing

The battery system in which the method is used comprises a plurality of lithium-ion cells and a battery management system (BMS), wherein cell units composed of individual cells or parallel-connected groups of cells are each provided with a balancing circuit. The battery management system is set up to execute a charge equalization, that is to say to carry out a balancing operation, at predefined times. To this end, in a cell or cell group, the cell voltage of which is raised in comparison with at least one other cell or cell group, the balancing circuit is actuated in order to draw charge from this cell or cell group until the cell voltages are equalized.

The balancing is typically carried out during a rest phase, for example after charging, and at a time at which the battery system is not subject to any loading. If the battery system is installed in an electric vehicle, the balancing can be carried out at an arbitrary time, other than during driving operation, preferably directly after the charging of the store. In a hybrid electric vehicle or plug-in hybrid electric vehicle, driving operation using the combustion engine is also considered. According to the invention, the time and the exact method of balancing are not specifically limited, provided that the charge transferred in the balancing operation for each cell can be ascertained by the BMS.

Figure 1:
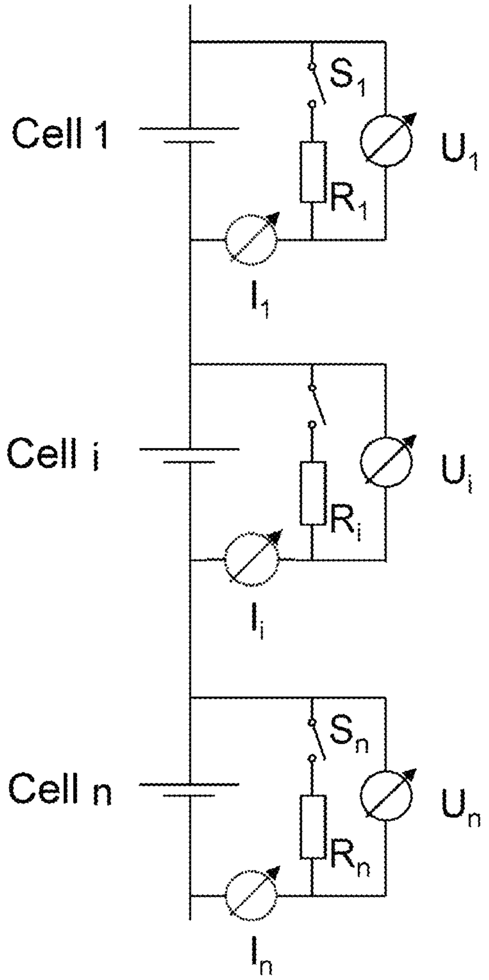
FIG. 1 schematically shows the structure of a string of cell units which are each provided with a discharge circuit and a voltage measurement device.

In passive balancing, charge is drawn from the cell with an increased cell voltage (and thus increased SOC) and said charge is dissipated to a load resistor (shunt). A simplified schematic illustration of such a passive balancing circuit for the case of N series-connected cells is shown in FIG. 1. For each cell i, the cell voltage $U_i$ is monitored by the BMS. In addition, each cell is provided with a shunt circuit, which comprises at least one switch $S_i$ (for example a MOSFET), which is controlled by the BMS, and the actual parallel resistor (shunt) $R_i$.

In order to keep the apparatus-based outlay low, an option for directly measuring the current $I_i$ in the balancing circuit is not provided. Instead, the balancing current is calculated as $I_i(t)=U_i(t)/R$ from the resistance value $R_i$ and the voltage profile $U_i(t)$ measured during the balancing. Integration over time provides the charge that flowed.

Determination of the Load Resistance

The calibration method is used to accurately determine the resistance value $R_i$ in order to be able to precisely ascertain the balancing current and the charge that has flowed. The current flowing via the load resistor during balancing is generally $I_i=U_i/R_i$, wherein $U_i$ is a function of the state of charge ($SOC_i$) of the cell unit and consequently does not have to be constant over time but depends on the charge $Q_i$ that has already flowed. The charge is thus calculated as:

$$Q_i = \int I_i dt = 1/R_i * \int U_i dt.$$

As stated above, the battery management system is capable of measuring $U_i$ to a high degree of precision and if necessary plotting it over time in order for example to be able to monitor the state of charge (SOC) of the cell unit.

The invention is based on the idea of ascertaining the calibration parameter $R_i$ based on the above formula by virtue of determining the duration of the actuation of the discharge circuit (discharge duration) $t_i$, the charge $Q_i$ that has flowed and the voltage profile $U_i(t)$. $R_i$ can then be calculated as:

$$R_i = 1/Q_i * \int U_i dt.$$

The measurements and calculations required for this are performed by the battery management system, which is configured to monitor the voltage and control the discharge circuit anyway.

In order to determine the charge $Q_i$ that has flowed, for example the supplying of a known charge and its subsequent drawing via the discharge circuit are considered, or the calculation of the charge from the differential capacitance and the voltage profile during the discharge.

Determination of $Q_i$ by Supplying a Known Charge

Figure 2:
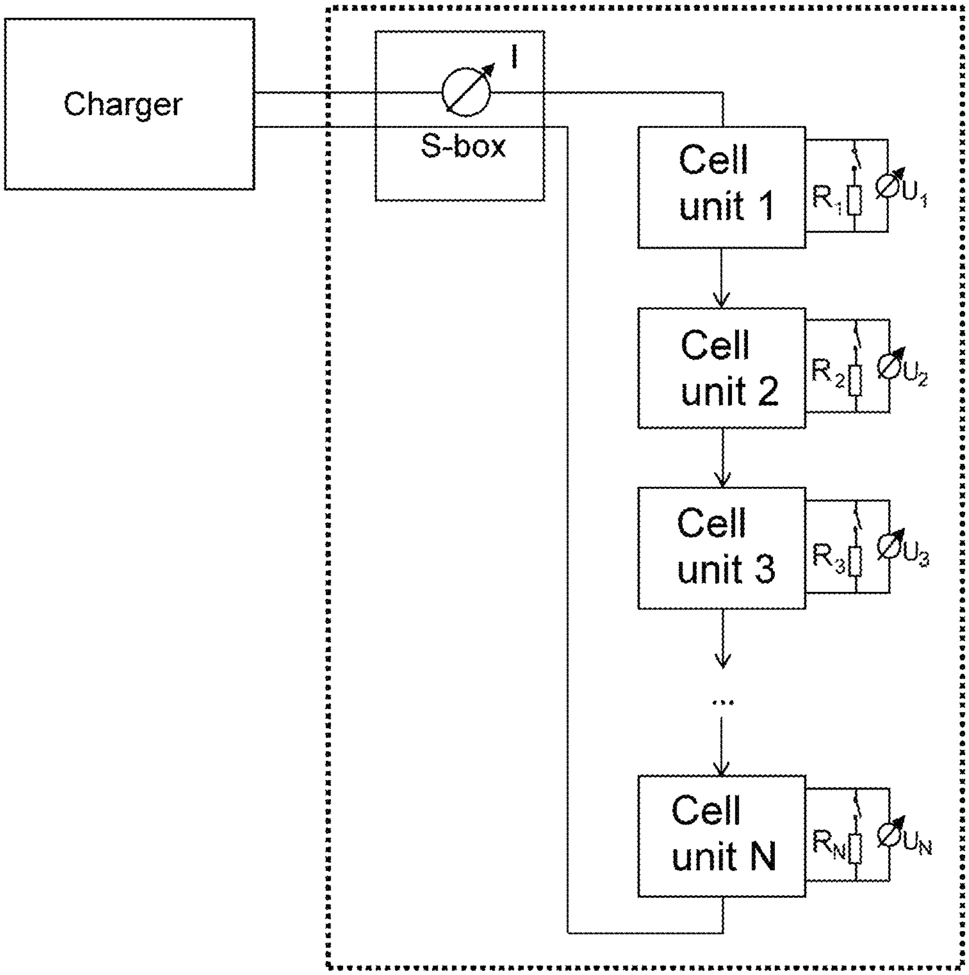
FIG. 2 schematically shows the structure during the determination of $Q_i$ through supplying and subsequently dissipating a previously known charge.

A first option for determining $Q_i$ consists in supplying a known charge Q, which leads to an increase in the voltage $U_i$ on account of the increase of the state of charge of the cell unit. Then, the discharge circuit is actuated until the increased voltage has fallen back to the starting value. The state of charge (SOC) of the cell unit is then again also the same as before the charge was supplied, that is to say the charge $Q_i$ that flowed during discharge corresponds to the charge Q supplied. The schematic structure is shown in FIG. 2.

This embodiment of the method according to the invention comprises the following steps:

(1) determination of the initial voltage $U_{i,0}$ of each cell unit i of the string by way of the battery management system;

(2) application of a previously known charging current I to the string for a predetermined time $t_L$ in order to supply the known charge $Q=\int I dt$ to each cell unit;

(3) drawing of the previously supplied charge $Q_i=Q$ by virtue of the discharge circuit being actuated until the initial voltage $U_{i,0}$ is reached again, with the result that the discharge duration $t_i$ meets the condition $U_i(t_i)=U_{i,0}$;

(4) determination of $R_i$ as:

$$R_i = \frac{1}{Q} \int_0^{t_i(U=U_{i,0})} U_i(t)\,dt$$

wherein $t_i(U=U_{i,0})$ represents the discharge duration after which the voltage has fallen back to the initial value $U_{i,0}$.

First of all, in step (1), the voltage $U_{i,0}$ is measured, which represents the measure for the initial SOC of the cell unit, which must also be equal to the final SOC when the subsequent step (3) has ended.

Subsequently, in step (2), the entire string is charged with a defined charging current for a defined period. This step can be done using a conventional charger and differs from normal charging only in that the battery system is not fully charged but only a known charge Q, which is calculated by integrating the charging current over time, is supplied.

The charging method is not specifically limited. For example, the charging can take place with a constant current or a constant voltage. It is only necessary to measure the profile of the charging current I over time in order to be able to calculate the charge. To control the charging process, the battery system or the charging device is provided with a current measurement device anyway, which can be used for determining the charge. In the embodiment shown in FIG. 2, the current measurement device is integrated into the battery system ("s-box"). If necessary, a highly precise current measurement device can be introduced into the charging circuit in order to be able to ascertain the charge with a high degree of accuracy.

Step (2) does not require any physical access to the individual cell units but can be carried out using the installed battery system in field deployment using conventional charging devices. At most, a highly precise current measurement device may be required as additional equipment.

Since the string consists purely of series-connected cell units, the current flowing through each cell and thus in good approximation also the supplied charge of each cell unit is the same and can be calculated as $Q=\int I dt$.

After the charging has ended, if necessary there may be a slow exchange of charge between the cells on account of slightly different cell voltages, with the result that the charges can drift apart from one another over time. However, this effect is negligible in the method according to the invention due to the slow timescale, in particular when step (3) is carried out directly after step (2).

By increasing the SOC on account of the supplied charge Q, after step (2) the cell voltage in the cell units is increased with respect to $U_{i,0}$. In step (3), the cell units are discharged during actuation of the discharge circuit until $U_{i,0}$ and thus the original SOC is reached again. The charge $Q_i$ dissipated here is thus equal to the charge supplied in step (2).

By plotting the voltage profile during the discharge and integrating over time, the value of the load resistance $R_i$ is then calculated in step (4) as:

$$R_i = \frac{1}{Q} \int_0^{t_i(U=U_{i,0})} U_i(t)\,dt.$$

No specific laboratory equipment is required and no measures to be executed externally at the battery system itself are required.

Determination of $Q_i$ Based on the Previously Known Differential Capacitance

As an alternative, $Q_i$ can also be determined from the differential capacitance $C_i=dQ_i/dU_i$, which is stored in the battery management system, or can be calculated from the stored charge/voltage correlation data $Q_i(U_i)$, which are required anyway in order to ascertain the SOC, by differentiating according to the voltage. This embodiment of the method according to the invention using the differential capacitance $C_i$ comprises the following steps:

(1) actuation of the discharge circuit in order to discharge each cell unit i via the resistor $R_i$ for a predetermined time $t_i$, with simultaneous measurement of the voltage $U_i(t)$ during the discharge in order to obtain the voltage profile over time;

(2) determination of the charge $Q_i$ drawn during the predetermined time $t_i$ from $C_i$ and $U_i(t)$ as $$Q_i = \int C_i dU_i = \int_0^{t_i} C_i \frac{dU_i(t)}{dt} dt$$

(3) determination of $R_i$ as:

$$R_i = \frac{1}{Q_i} \int_0^{t_i} U_i(t)\,dt.$$

In step (1), the cell is again discharged in a controlled manner and the voltage profile during discharge is measured. However, in contrast to the first version, the charge drawn is not previously known but must be calculated in step (2) from the previously known differential capacitance $C_i$ and the measured voltage profile $U_i(t)$. The differential capacitance $C_i$ is either stored itself in the battery management system or it is calculated on the fly from the previously known no-load characteristic curve.

In step (3), the determination of $R_i$ is finally carried out in an analogous manner to the first embodiment.

What is claimed is:

1. A method for calibrating a passive balancing system in a battery system comprising a plurality of lithium-ion cells and a battery management system, wherein cell units composed of individual cells or parallel-connected groups of a plurality of cells are each provided with a discharge circuit having a load resistor $R_i$ representing a calibration parameter, and the cell units are connected in series in strings, and wherein the battery management system is configured to measure a voltage $U_i$ of each cell unit and to actuate the discharge circuit at a selectable time in order to discharge the cell unit in a controlled manner via the load resistor $R_i$, wherein the method comprises the steps of:

determining an initial voltage $U_{i,0}$ of each cell unit of the string by way of the battery management system;

applying a previously known charging current I to the string for a predetermined time tin order to supply a known charge $Q=\int I dt$ to each cell unit;

actuating the discharge circuit of the cell unit in order to draw a charge $Q_i$, and determining $Q_i$ and a voltage profile over time $U_i(t)$, such that the method includes drawing the previously supplied charge $Q_i=Q$ by virtue of the discharge circuit being actuated until the initial voltage $U_{i,0}$ is reached again;

measuring a duration of a discharge time $t_i$ for which duration the balancing circuit was actually actuated after which the voltage has fallen back to a value of the initial voltage $U_{i,0}$ such that a condition $U_i(t_i)=U_{i,0}$ is met, wherein the discharge time $t_i$ is a measured value and is not predetermined prior to actuating the discharge circuit to draw the charge $Q_i$; and determining $R_i$ as:

$$R_i = \frac{1}{Q}\int_0^{t_i} U_i(t)\,dt.$$

2. A method for calibrating a passive balancing system in a battery system comprising a plurality of lithium-ion cells and a battery management system, wherein cell units composed of individual cells or parallel-connected groups of a plurality of cells are each provided with a discharge circuit having a load resistor $R_i$ representing a calibration parameter, and the cell units are connected in series in strings, and wherein the battery management system is configured to measure a voltage $U_i$ of each cell unit and to actuate the discharge circuit at a selectable time in order to discharge the cell unit in a controlled manner via the load resistor $R_i$, wherein the differential capacitance of each cell unit is $C_i=dQ_i/dU_i$, wherein dQi represents the change in the charge, and is stored in the battery management system, the method comprising the steps of:

determining an initial voltage $U_{i,0}$ of each cell unit of the string by way of the battery management system;

applying a previously known charging current I to the string for a predetermined time tL in order to supply a known charge Q=∫Idt to each cell unit;

actuating the discharge circuit in order to discharge each cell unit via the resistor $R_i$ for a discharge time $t_i$, wherein discharge time t; is a predetermined duration of time, with simultaneous measurement of a voltage during the discharge in order to obtain a voltage profile over time $U_i(t)$;

determining a charge Qi drawn during the discharge time ti from $C_i$ and Ui(t) as:

$$Q_i = \int C_i dU_i = \int_0^{t_i} C_i \frac{dU_i(t)}{dt}dt$$

and determining $R_i$ as:

$$R_i = \frac{1}{Q_i}\int_0^{t_i} U_i(t)\,dt.$$

3. A battery system with passive balancing, comprising:

a plurality of lithium-ion cells; and a battery management system, wherein cell units composed of individual cells or parallel-connected groups of the plurality of cells are each provided with a discharge circuit having a load resistor $R_i$, and the cell units are connected in series in strings, wherein the battery management unit is configured to measure the voltage $U_i$ of each cell unit and to actuate the discharge circuit at a selectable time in order to discharge the cell unit in a controlled manner via the load resistor $R_i$, wherein the battery system is configured to:

determine an initial voltage $U_{i,0}$ of each cell unit of the string;

apply a previously known charging current I to the string for a predetermined time $t_L$ in order to supply a known charge Q=∫Idt to each cell unit;

actuate the discharge circuit of the cell unit in order to draw a charge $Q_i$, and determines $Q_i$ and a voltage profile over time $U_i(t)$, such that the previously supplied charge $Q_i=Q$ is drawn by virtue of the discharge circuit being actuated until the initial voltage $U_{i,0}$ is reached again;

measure a duration of a discharge time $t_i$ for which duration the balancing circuit was actually actuated after which the voltage has fallen back to a value of the initial voltage $U_{i,0}$ such that a condition $U_i(t_i)=U_{i,0}$ is met, wherein the discharge time $t_i$ is a measured value and is not predetermined prior to actuating the discharge circuit to draw the charge $Q_i$; and determine $R_i$ as:

$$R_i = \frac{1}{Q}\int_0^{t_i} U_i(t)dt.$$

* * * * *